(12) United States Patent
Kirsammer et al.

(10) Patent No.: US 10,491,160 B2
(45) Date of Patent: Nov. 26, 2019

(54) MEASURING DEVICE

(71) Applicant: Siemens Aktiengesellschaft, Munich (DE)

(72) Inventors: Florian Kirsammer, Karlsruhe (DE); Hans-Guenther Kleih, Bruchsal (DE); Michael Ludwig, Karlsruhe (DE); Guenter Marcaux, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 280 days.

(21) Appl. No.: 15/660,022

(22) Filed: Jul. 26, 2017

(65) Prior Publication Data

US 2018/0034413 A1   Feb. 1, 2018

(30) Foreign Application Priority Data

Jul. 27, 2016   (EP) ..................................... 16181379

(51) Int. Cl.
*H03D 3/24*     (2006.01)
*G01D 3/028*    (2006.01)
(Continued)

(52) U.S. Cl.
CPC ............... *H03D 3/24* (2013.01); *G01D 3/028* (2013.01); *H03D 3/007* (2013.01);
(Continued)

(58) Field of Classification Search
CPC .......... H03D 3/005; H03D 3/007; H03D 3/24; G01D 5/243; G01D 5/244; G01D 3/028;
(Continued)

(56) References Cited

U.S. PATENT DOCUMENTS 3,557,351 A * 1/1971 Doering .................... G01B 7/06
                                                702/194
6,998,962 B2 * 2/2006 Cope ....................... G02B 6/483
                                                340/12.37
(Continued)

FOREIGN PATENT DOCUMENTS

DE      19743132 A1 *  4/1999  .......... G01S 7/4021
DE      10345507 A1 *  5/2005  ......... G01N 21/3504
(Continued)

*Primary Examiner* — Francis C Gray
(74) *Attorney, Agent, or Firm* — Cozen O'Connor

(57) ABSTRACT

A measuring device in which a non-electrical variable is converted into an electrical measurement signal via an electrical alternating current having a frequency, wherein the measurement signal contains a signal portion dependent on the non-electrical variable and is double the frequency, and a fault signal portion dependent on the alternating current and is at the frequency, where the measurement signal is pre-processed and digitized to generate a digital signal that is detected and processed to generate a measured value proportional to the non-electrical variable and to generate a fault signal value, wherein the fault signal value is utilized to normalize the measured value that is normalized in a normalizing stage, by forming the quotient using the square of the fault signal value, and is output as a normalized measured value.

14 Claims, 2 Drawing Sheets

(51) Int. Cl.
*H03D 3/00* (2006.01)
*H04L 27/227* (2006.01)
*H04L 27/38* (2006.01)
*H04L 27/00* (2006.01)

(52) U.S. Cl.
CPC ...... *H04L 27/2273* (2013.01); *H04L 27/3809* (2013.01); *H03D 3/005* (2013.01); *H04L 2027/0057* (2013.01)

(58) Field of Classification Search
CPC ......... H04L 2027/0057; H04L 27/2273; H04L 27/3809
See application file for complete search history.

(56) References Cited

U.S. PATENT DOCUMENTS

| | | | | |
|---|---|---|---|---|
| 7,117,029 B2 * | 10/2006 | Stridh | ................. | A61B 5/0464 600/515 |
| 2010/0066355 A1 * | 3/2010 | Krause | ................. | G01D 18/00 324/228 |
| 2010/0188149 A1 | 7/2010 | Kimmig et al. | | |
| 2012/0091346 A1 * | 4/2012 | Bitter | ................. | G01N 21/276 250/341.7 |

FOREIGN PATENT DOCUMENTS

| | | | | |
|---|---|---|---|---|
| DE | 102012212982 | | 5/2013 | |
| DE | 102012212978 | | 8/2013 | |
| EP | 2130295 | | 12/2009 | |
| EP | 2163861 A1 * | | 3/2010 | ............. G01D 18/00 |
| FR | 2820211 | | 8/2002 | |
| WO | WO-2009101197 A1 * | | 8/2009 | ............. G01N 21/37 |

* cited by examiner

MEASURING DEVICE

BACKGROUND OF THE INVENTION

1. Field of the Invention

The present invention relates to gas analyzers and, more particularly, to a measuring device for a non-electrical variable.

2. Detailed Description of the Related Art

DE 10 2012 212 978 B3 discloses a conventional measuring device in which a further value serves as a diagnostic value. This utilizes the realization that, in many cases, when there is a modulated conversion of a non-electrical variable into an electrical measurement signal a fault signal portion of double or half the modulation frequency becomes part of the actual measurement signal (useful signal). Instead of damping such fault signal portions as much as possible via suitable filtering measures, such that they have no further effect on the measurement result, the fault signals are utilized to monitor the complete signal processing path from modulation to determination of the measured value, as the measurement operation is performed. Here, the diagnostic value is compared with an expected value. Provided the diagnostic value lies within a tolerance range around the expected value, the signal processing can be regarded as correct. Otherwise, a fault or alarm message is generated and, for example, the measured value is adjusted for the purpose of safety.

An example of a conventional measuring device that may be provided is a gas analyzer that operates by the paramagnetic alternating pressure method, utilizing the paramagnetic properties of oxygen to generate the measured effect. For this purpose, an electromagnet is controlled at an alternating current of a particular frequency f. The measured effect is proportional to the square of the magnetic field. As a result the analogue electrical measurement signal includes a useful signal portion that is dependent on the non-electrical variable and has double the frequency, or 2f. Moreover, because of transformer-related interference, there is also present in the electrical measurement signal a fault signal portion having the control frequency of the electromagnet, that is the single frequency f.

Changes in the properties of the magnetic circuit, such as the winding resistance or inductance, influence the paramagnetic measured effect and hence the measured value.

SUMMARY OF THE INVENTION

In view of the foregoing, it is an object of the invention to minimize the influence of the above-described kind on the measured value at the smallest possible expense for instrumentation.

This and other objects and advantages are achieved in accordance by a measuring device for a non-electrical variable having a measuring unit for converting the non-electrical variable indirectly into an electrical measurement signal via an electrical alternating current of a frequency, where the electrical measurement signal contains a useful signal portion, which is dependent on the non-electrical variable and is of the double frequency, and a fault signal portion, which is dependent on the alternating current and is of the frequency. The measuring device also includes a signal pre-processing device for pre-processing and digitizing the measurement signal to generate a digital signal, and a signal processing device for processing the digital signal via signal processing software to give a measured value, where the signal processing software is intended to detect the digital signal in a phase-sensitive manner, by multiplication with a reference signal at the double frequency, and process the digital signal by subsequent low-pass filtering to generate the measured value, which is proportional to the non-electrical variable, and detect the digital signal in a phase-sensitive manner, by multiplication with a further reference signal at the single frequency, and process the digital signal by subsequent low-pass filtering to give a fault signal value.

In accordance with the invention, the signal processing device includes a normalizing stage for normalizing the measured value by forming the quotient using the square of the fault signal value, and to output the measured value as a normalized measured value.

Converting the non-electrical variable into the electrical measurement signal is performed via the electrical alternating current in a manner relating to output, with the result that the useful signal portion has a frequency 2f double that of the alternating current. The essential advantage of the measuring device in accordance with the invention consists in the fact that the measured value determined by the signal processing from the useful signal portion is normalized using the square, i.e., the output, of the alternating current, without this having to be measured. As a result, any expense for instrumentation connected with measuring current is eliminated.

A further advantage consists in the fact that the useful signal portion and the fault signal portion used for normalization thereof undergo the same analogue and virtually the same digital signal processing, with the result that the effects on the measured value of faults or changes in the signal path are compensated when the measured value is normalized.

It is possible for the signal processing software to determine the fault signal value alternately with the measured value, or for the signal processing software to be present in duplicate and for the digital signal detected at the double frequency and the digital signal detected at the single frequency to be processed in parallel.

The measuring unit of the measuring device in accordance with the invention may in particular be a measuring unit that operates by the paramagnetic alternating pressure method, the thermo-physical principle or the optical principle, preferably being a gas analyzer.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For the purpose of explaining the invention, reference will be made below to the figures in the drawings, in each case by way of example, in which.

DETAILED DESCRIPTION OF THE EXEMPLARY EMBODIMENTS

Figure 1:
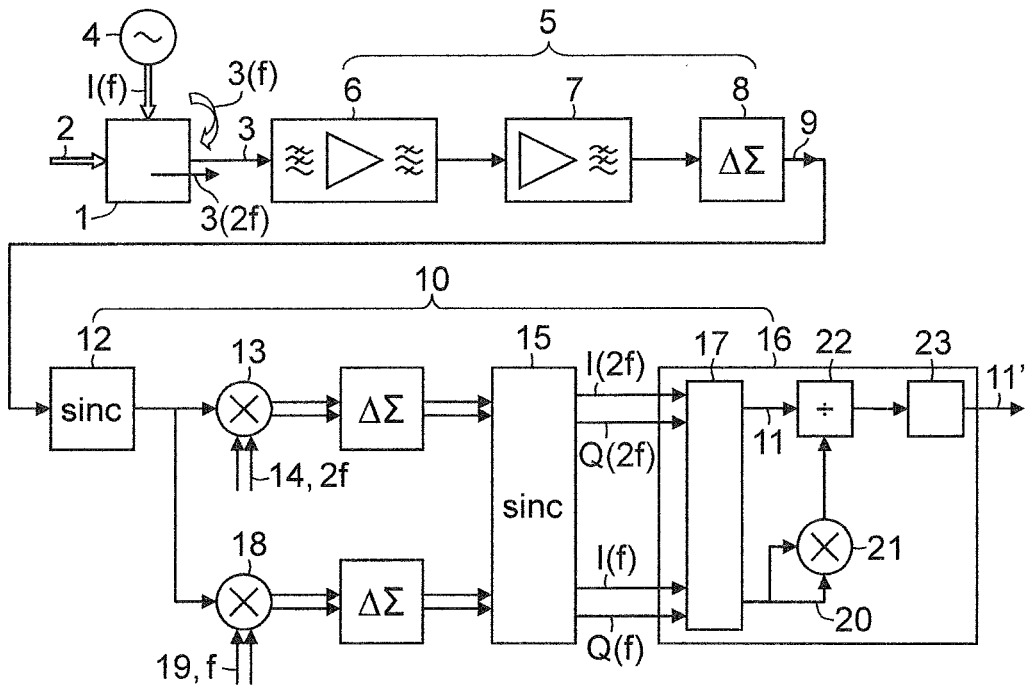
FIG. 1 shows a block diagram of the measuring device in accordance with the invention.

The measuring device shown in FIG. 1 has a measuring unit 1 that converts a non-electrical variable 2 into an electrical measurement signal (raw signal) 3. Conversion is performed via a sinusoidal electrical alternating current I(f) of frequency f, which is supplied by a current or voltage source 4. The current or voltage source 4 may also form part of the measuring unit 1. The conversion is performed in a manner relating to output, with the result that the measurement signal 3 contains a useful signal portion 3(2f) having the double frequency 2f. Thus, in the case of a gas analyzer that operates by the paramagnetic alternating pressure method, and oxygen molecules are moved in an alternating magnetic field generated by the alternating current I(f). If two gases of different oxygen contents come together in the magnetic field, then an alternating pressure difference is established between them and is detected as the measurement signal 3. In the case of a measuring device, such as a gas analyzer, operating by the thermo-physical principle, the alternating current I(f) heats a heating element to detect, by way of the flow of heat to the surrounding gas, its thermal conductivity or flow. In the case of a gas analyzer that operates by the optical principle, the alternating current I(f) controls a radiation source whereof the radiation is measured after it has passed through or has been reflected at a measurement medium. In all these cases, which are mentioned by way of example, the useful signal portion 3(2f) of the measurement signal is proportional to the square of the alternating current I(f).

When the non-electrical variable 2 is converted into the measurement signal 3, it is furthermore possible for a fault signal portion 3(f) of the frequency f of the alternating current I(f) to become part of the measurement signal 3. Thus, for example, in the case of the gas analyzer operating by the paramagnetic alternating pressure method, the fault signal portion 3(f) can become part of the measurement signal 3 as a result of transformer-related interference between the electromagnet and the sensor for detecting the pressure difference and/or the downstream electronics. In the case of the above-mentioned measuring device operating by the thermo-physical principle, the voltage across the heating element that may be used as the measurement signal 3 is dependent on both the alternating current I(f). The voltage across the heating element is also dependent on the change in resistance of the heating element as a result of the alternating current I(f) and the flow of heat to the surrounding measurement medium, where the change in resistance varies with the double frequency 2f.

In a signal pre-processing device 5, the measurement signal 3 having the useful signal portion 3(2f) and the fault signal portion 3(f) is filtered, amplified and, by delta-sigma modulation, converted into a bit-serial digital signal (bit stream) 9 in a plurality of stages 6, 7, 8. Furthermore, the useful signal portion in the digital signal 9 is processed in a digital signal processing device 10 using signal processing software, to give a measured value 11. For this purpose, the bit-serial digital signal 9 first undergoes low-pass filtering in a sinc filter 12 and the scan rate is decimated. Then, the digital signal 9 that has undergone low-pass filtering is detected in a phase-sensitive manner by multiplication 13 with a reference signal 14 and the reference signal 14 phase-shifted by 90° (sine/cosine multiplication) at the double frequency 2f, in order to determine the in-phase component I(2f) and the quadrature component Q(2f) by subsequent low-pass filtering 15 (two-phase lock-in technique, for example EP 2 130 295 B1) and to process them in further signal processing steps 16 to give the measured value 11. The further signal processing steps 16 include, for example, FIR Hamming filtering 17.

The fault signal portion in the digital signal 9 that has undergone low-pass filtering and whereof the scan rate has been decimated is detected in a phase-sensitive manner by a further sine/cosine multiplication 18 with a reference signal 19 at the single frequency f. As a result of the subsequent low-pass filtering 15, the in-phase component I(2f) and the quadrature component Q(2f) are determined and are processed in the further signal processing steps 16 to give a fault signal value 20. With the exception of the different multiplication, processing of the fault signal portion performs the same steps as those for the useful signal portion of the measurement signal 3. Here, the signal processing following the multiplication 13 and 18 may be performed in parallel or alternately.

The fault signal value 20 is squared in a multiplier 21 and is then supplied to a normalizing stage 22 in which the measured value 11 is normalized by forming the quotient using the square of the fault signal value 20 and, where appropriate after further processing steps 23 such as temperature and/or pressure compensation, is output as the normalized measured value 11', for example being displayed, or communicated to other devices within a process automation system.

As disclosed by DE 10 2012 212 978 B3, which was mentioned in the introduction and is not itself described here, the fault signal value 20 may be compared in a comparator device with an expected value that is stored in a memory and that has previously been calculated or determined at the time of calibrating the intact measuring device. If the diagnostic value 20 differs from the expected value by more than a permitted amount, a fault message can be generated and, for example, using the measured value 11', it can be fixed at a safety-related value.

Figure 2:
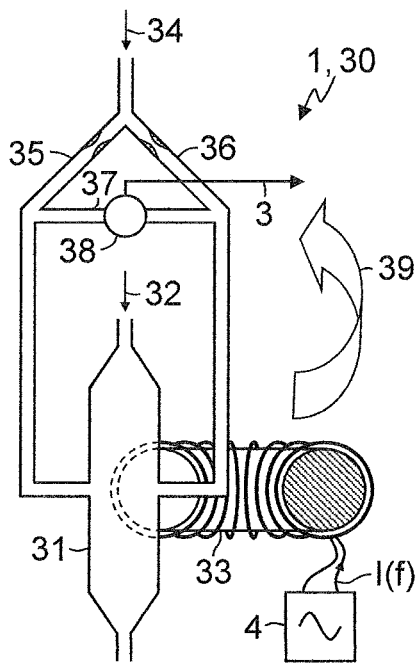
FIG. 2 shows a measuring unit in the form of a gas analyzer operating by the paramagnetic alternating pressure method.

FIG. 2 shows by way of example a measuring unit 1 in the form of a gas analyzer 30 that operates by the paramagnetic alternating pressure method. The measuring unit 1 has a measuring chamber 31 through which there flows a measurement gas 32 whereof the oxygen content is to be determined. Part of the measuring chamber 31 lies between the pole shoes of an electromagnet 33 supplied with alternating current, in the magnetic field generated thereby. The electromagnet 33 is controlled by the current or voltage source 4 with the alternating current I(f) at the frequency f. A comparison gas 34, needed to achieve the measurement effect, is supplied to the measuring chamber 31 through two channels 35, 36 of the same shape, with one of the two comparison gas flows meeting the measurement gas 32 in the region of the magnetic field. Because the paramagnetic property of oxygen molecules results in their being moved toward a higher field strength in the magnetic field. Consequently, an alternating pressure difference with a frequency of 2f is established between the comparison gas flows in the channels 35, 36. This results in an alternating flow in a connection channel 37 between the two channels 35, 36, which is detected by a microflow sensor 38 and converted into the electrical measurement signal 3. As indicated by the arrow 39, the measurement signal 3 at the frequency 2f is overlaid with a fault signal portion 3(f) having the frequency f of the alternating current I(f), as a result of transformer-related interference between the electromagnet 33 and the flow sensor 38 or the downstream electronics 5 (FIG. 1).

Figure 3:
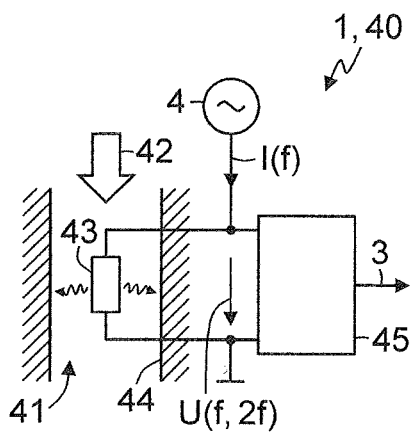
FIG. 3 illustrates the principle of a measuring unit in the form of a thermal conductivity gas analyzer.

FIG. 3 shows by way of example the principle of a measuring unit 1 in the form of a thermal conductivity gas analyzer 40. The measuring unit 1 has a measurement channel 41 through which there flows a measurement gas 42 having two, or where appropriate more, different gas components. A heating resistor 43 is arranged in the measurement channel 41 such that it extends in the longitudinal direction of the measurement channel 41 and the measurement gas 42 flows around it. The heating resistor 43 is controlled by the current or voltage source 4 with the alternating current I(f) at the frequency f, with the result that the heat output pulses at the square of the alternating current I(f) and at the double frequency 2f. Heat flows from the heating resistor 43 to the wall 44 of the measurement channel 41, where the heat flow depends on the thermal conductivity of the measurement gas 42. The temperature-dependent electrical resistance of the heating resistor 43 is thus dependent on the square of the alternating current I(f) and the thermal conductivity of the measurement gas 42, and varies with the double frequency 2f. There is a voltage drop U(f, 2f) across the heating resistor 43, where this voltage contains a useful signal portion at the double frequency 2f, which contains information on the thermal conductivity and thus the composition of the measurement gas 42, and a fault signal portion at the single frequency f. This voltage is detected by a voltage measuring device 45 and forms the measurement signal 3, which can be further processed in accordance with the example from FIG. 1. In practice, the heating resistor 43 may be arranged with reference resistors in the form of a measuring bridge that is supplied with the alternating current I(f) and whereof the diagonal voltage is detected as the measurement signal 3. If the heating resistor 43 is arranged such that it extends transversely to the longitudinal direction of the measurement channel 41, then the heat flow occurs substantially transversely in the direction of flow of the measurement gas 42, so the measuring unit 1 operates as a flow or through-flow sensor.

Figure 4:
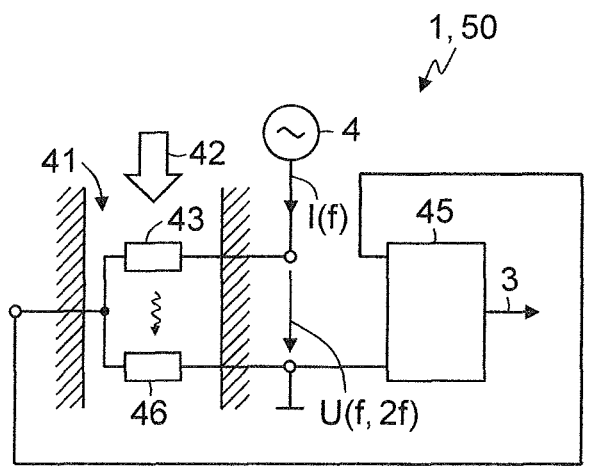
FIG. 4 illustrates the principle of a measuring unit in the form of a flow sensor.

FIG. 4 shows by way of example the principle of a measuring unit 1 in the form of a calorimetric flow sensor 50. The flow sensor 50 differs from the thermal conductivity gas analyzer 40 shown in FIG. 3 substantially in that a second temperature-dependent resistor 46 is provided, which is arranged downstream of the heating resistor 43, as seen in the direction of flow of the measurement gas 42 or in general a fluid 42, and both resistors 43, 46 are oriented transversely to the direction of flow. In the illustrated example, the resistors 43, 46 are connected in series and form a structural unit having three terminals. The series connection of the resistors 43, 46 is controlled by the current or voltage source 4 with the alternating current I(f) at the frequency f, with the result that the heat output pulses at the square of the alternating current I(f) and at the double frequency 2f. Heat flows from the heating resistor 43 to the temperature-dependent resistor 46, where the heat flow depends on the thermal conductivity and flow of the fluid 42. If the composition of the fluid 42 does not change, then the heat flow only varies with the flow. The temperature-dependent resistor 46 varies with the square of the alternating current I(f) and hence with the double frequency 2f. There is a voltage drop U(f, 2f) across the temperature-resistant resistor 46, where this voltage contains a useful signal portion at the double frequency 2f, which contains information on the thermal conductivity and thus the composition of the fluid 42, and a fault signal portion at the single frequency f. This voltage is detected by a voltage measuring device 45 and forms the measurement signal 3, which can be further processed in accordance with the example from FIG. 1. In practice, the heating resistor 43 and the temperature-dependent resistor 46 may be arranged with reference resistors as a measuring bridge that is supplied with the alternating current I(f) and whereof the diagonal voltage, is detected as the measurement signal 3.

In the example shown in FIG. 4, the temperature-dependent resistor 46, as well as the heating resistor 43, is also heated by the current I(f).

Figure 5:
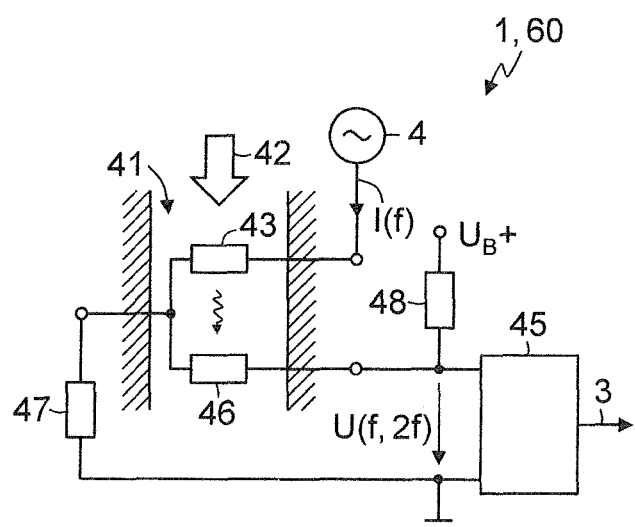
FIG. 5 shows an exemplary embodiment of the flow sensor of FIG. 4.

FIG. 5 shows an exemplary embodiment of the calorimetric flow sensor 60 in which, unlike the example described above, the current I(f) is diverted to earth at the terminal between the heating resistor 43 and the temperature-dependent resistor 46, to bypass the latter by way of a supplementary resistor 47. The temperature-dependent resistor 46 is connected via a further supplementary resistor 48 to a voltage source having a DC voltage $U_{B+}$. The voltage measuring device 45 detects the voltage U(f, 2f) that falls across the resistors 46, 47 and forms the measurement signal 3, which can be further processed in accordance with the example from FIG. 1. The voltage U(f, 2f) comprises the partial voltage, resulting from the alternating voltage I(f), across the supplementary resistor 47 at the frequency f and the partial voltage that drops across the temperature-dependent resistor 46 and contains the useful signal portion at the double frequency 2f, which contains the information on the flow.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A measuring device for a non-electrical variable, comprising:
    a measuring unit which indirectly converts the non-electrical variable into an electrical measurement signal via an electrical alternating current having a frequency, the electrical measurement signal including a signal portion at a double frequency dependent on the non-electrical variable, and a fault signal portion having the frequency dependent on the alternating current;
    a signal pre-processing device which pre-processes and digitizes the measurement signal to obtain a digital signal; and a signal processing device which processes the digital signal via signal processing software to generate a measured value;

wherein the signal processing software is implemented to:
detect the digital signal in a phase-sensitive manner, by multiplication with a reference signal at the double frequency, and process said digital signal by subsequent low-pass filtering to generate the measured value, which is proportional to the non-electrical variable; and detect the digital signal in a phase-sensitive manner, by multiplication with a further reference signal at the single frequency, and process said digital signal by subsequent low-pass filtering to generate a fault signal value;

wherein the signal processing device includes a normalizing stage, which normalizes the measured value by forming the quotient using the square of the fault signal value, and outputs said measured value as a normalized measured value.

2. The measuring device as claimed in claim 1, wherein the signal processing software processes the digital signal that is detected at the double frequency and the digital signal that is detected at the single frequency, alternately.

3. The measuring device as claimed in claim 1, wherein the signal processing software is present in duplicate and processes the digital signal detected at the double frequency and the digital signal detected at the single frequency in parallel.

4. The measuring device as claimed in claim 1, wherein the measuring unit includes a gas analyzer that operates by a paramagnetic alternating pressure method, said gas analyzer having an electromagnet that generates a magnetic field of alternating flow strength and being controlled at the alternating current.

5. The measuring device as claimed in claim 2, wherein the measuring unit includes a gas analyzer that operates by a paramagnetic alternating pressure method, said gas analyzer having an electromagnet that generates a magnetic field of alternating flow strength and being controlled at the alternating current.

6. The measuring device as claimed in claim 3, wherein the measuring unit includes a gas analyzer that operates by a paramagnetic alternating pressure method, said gas analyzer having an electromagnet that generates a magnetic field of alternating flow strength and being controlled at the alternating current.

7. The measuring device as claimed in claim 1, wherein the measuring unit includes a heating resistor that is controlled at the alternating current and converts the non-electrical variable into the electrical measuring signal via thermo-physical principles.

8. The measuring device as claimed in claim 2, wherein the measuring unit includes a heating resistor that is controlled at the alternating current and converts the non-electrical variable into the electrical measuring signal via thermo-physical principles.

9. The measuring device as claimed in claim 3, wherein the measuring unit includes a heating resistor that is controlled at the alternating current and converts the non-electrical variable into the electrical measuring signal via thermo-physical principles.

10. The measuring device as claimed in claim 7, wherein the measuring unit is a thermal conductivity gas analyzer.

11. The measuring device as claimed in claim 7, wherein the measuring unit is a flow sensor.

12. The measuring device as claimed in claim 7, wherein a flow sensor is a calorimetric flow sensor.

13. The measuring device as claimed in claim 1, wherein the measuring unit includes a gas analyzer having a radiation source, said gas analyzer operating via an optical principle and being controlled by the alternating current.

14. The measuring device as claimed in claim 1, wherein the signal processing device includes a device which monitors the signal pre-processing device and the signal processing device by comparing the fault signal value with an expected value.

* * * * *